(12) United States Patent
Ju (10) Patent No.: US 7,026,230 B1
(45) Date of Patent: Apr. 11, 2006

(54) METHOD FOR FABRICATING A MEMORY DEVICE

(75) Inventor: Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 296 days.

(21) Appl. No.: 10/662,011

(22) Filed: Sep. 11, 2003

(51) Int. Cl.
H01L 21/22 (2006.01)
H01L 21/425 (2006.01)

(52) U.S. Cl. ............... 438/549; 438/514; 438/522; 438/527; 438/530; 438/542; 438/560

(58) Field of Classification Search ............... 438/560
See application file for complete search history.

(56) References Cited

U.S. PATENT DOCUMENTS

2002/0102793 A1* 8/2002 Wu .................. 438/257

* cited by examiner

*Primary Examiner*—Ha Nguyen
*Assistant Examiner*—Cheung Lee (57) ABSTRACT

The present invention is a method for fabricating a memory device. In one embodiment, an impurity concentration is created in a semiconductor substrate of a memory device. An annealing process is then performed. A second impurity concentration is created in a second region of the semiconductor substrate and a second annealing process is performed.

17 Claims, 12 Drawing Sheets

METHOD FOR FABRICATING A MEMORY DEVICE

FIELD OF THE INVENTION

The present invention relates to the field of semiconductor memory devices. More specifically, embodiments of the present invention pertain to non-volatile memory devices.

BACKGROUND OF THE INVENTION

Flash memory devices have found growing commercial success in the electronic device market due in part to the ability of flash memory devices to store electronic data over long periods of time without an electric power supply. Additionally, flash memory devices can be erased and programmed over multiple write cycles by an end user after they have been installed in an electronic device. This combined functionality is especially useful in electronic device applications such as cellular telephones, personal digital assistants, computer BIOS storage, etc., where power supply is intermittent and programmability and data retention are desired.

Flash memory technology evolved from electrically erasable read only memory (EEPROM) chip technology, which can be erased in situ. Unlike dynamic random access memory (DRAM) devices and static random memory (SRAM) devices in which a single byte can be erased, flash memory devices are typically erased in fixed multi-bit blocks or sectors.

Figure 1:
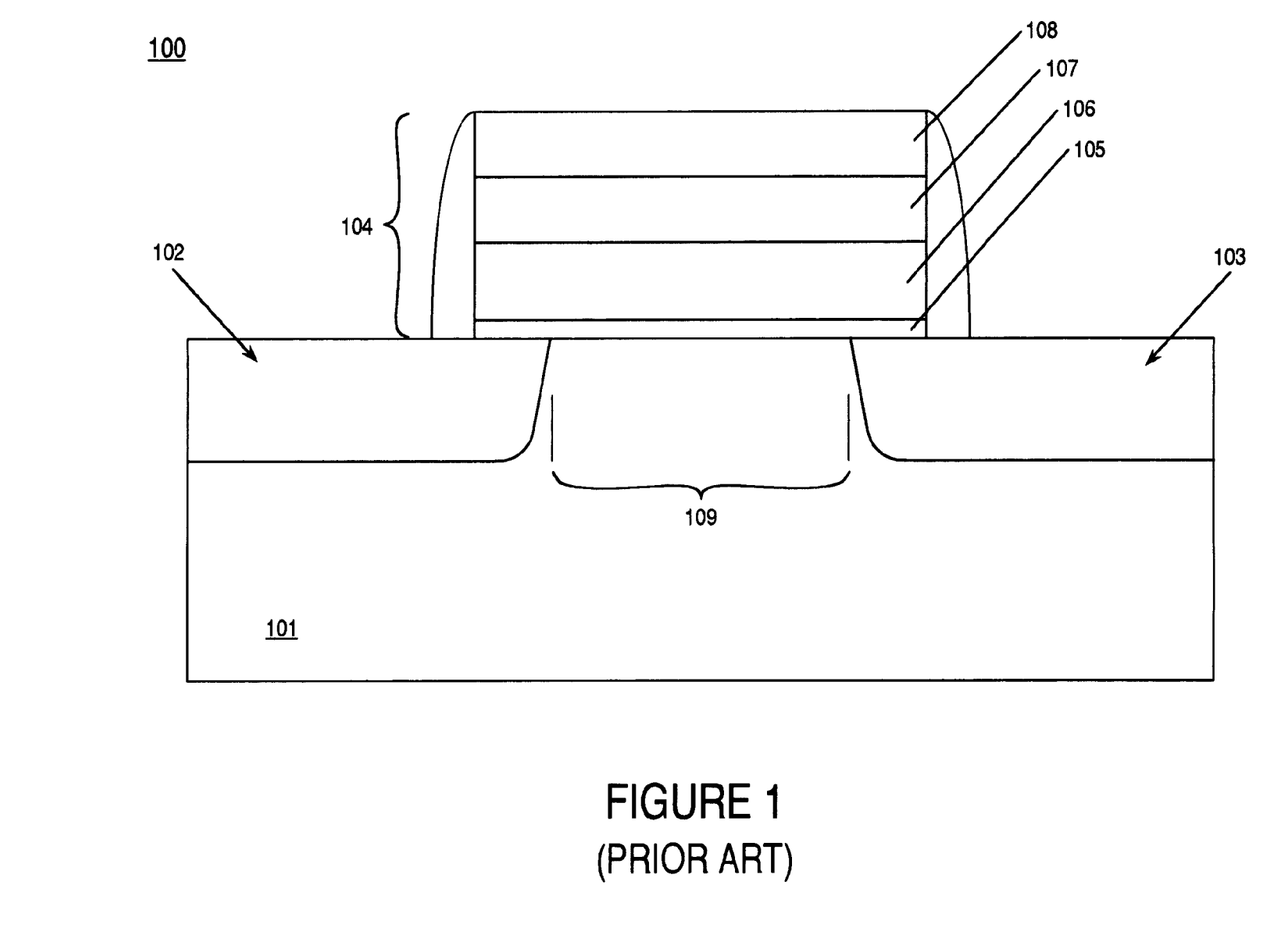
FIG. 1 is a cross section view of an exemplary prior art floating gate flash memory device.

One type of flash memory device is constructed in a cell structure wherein a single bit of information is stored in each cell. FIG. 1 is a cross section view of an exemplary flash memory device. Memory device 100 is comprised of a substrate 101 having a source region 102 and a drain region 103. Typically, substrate 101 is a crystalline silicon semiconductor substrate which has undergone an N-type (electron rich) doping in source region 102 and drain region 103. Memory device 100 further comprises a gate array 104. In the embodiment of FIG. 1, gate array 104 is comprised of a tunnel oxide layer 105, a floating gate 106, and insulating layer 107, and a control gate 108. A channel region 109 underlies gate array 104 between source region 102 and drain region 103.

The single bit stacked gate flash memory cell (e.g., memory cell 100 of FIG. 1) is typically programmed by "channel hot electron injection" in which a high positive voltage is applied to control gate 108, source 102 is coupled to ground and drain 103 is coupled to a positive voltage. The resulting high electric field across the channel region accelerates electrons toward the drain region and imparts enough energy for them to become hot electrons. The hot electrons are scattered (e.g., by impurities or the substrate lattice structure of the substrate in the channel region) and are redirected toward the floating gate by the vertical field established by the positive control gate voltage. If the electrons have enough energy, they can tunnel through gate oxide 105 into floating gate 106 and become trapped there. This changes the threshold voltage $V_T$, and thereby the channel conductance, of memory cell 100.

Memory cell 100 is read by connecting the source region 102 to ground, raising the voltage at the control gate 108 to the sense level and connecting the drain region 103 to a sense amplifier; if memory cell 100 is programmed, no current flows to the sense amplifier.

In order to erase memory cell 100, a voltage (e.g., 10 to 12 volts) is applied to source region 102, control gate 108 is held at a negative potential, and drain region 103 is allowed to float. Under these conditions, an electrical field is developed across tunnel oxide 105 between floating gate 106 and source 102. The electrons that are trapped in floating gate 106 flow toward and cluster at the portion of floating gate 106 overlying source region 102. The electrons are then extracted from floating gate 106 and into source region 101 by way of Fowler-Nordheim tunneling through tunnel oxide 105. Memory cell 100 is erased as the electrons are removed from floating gate 106.

Figure 2:
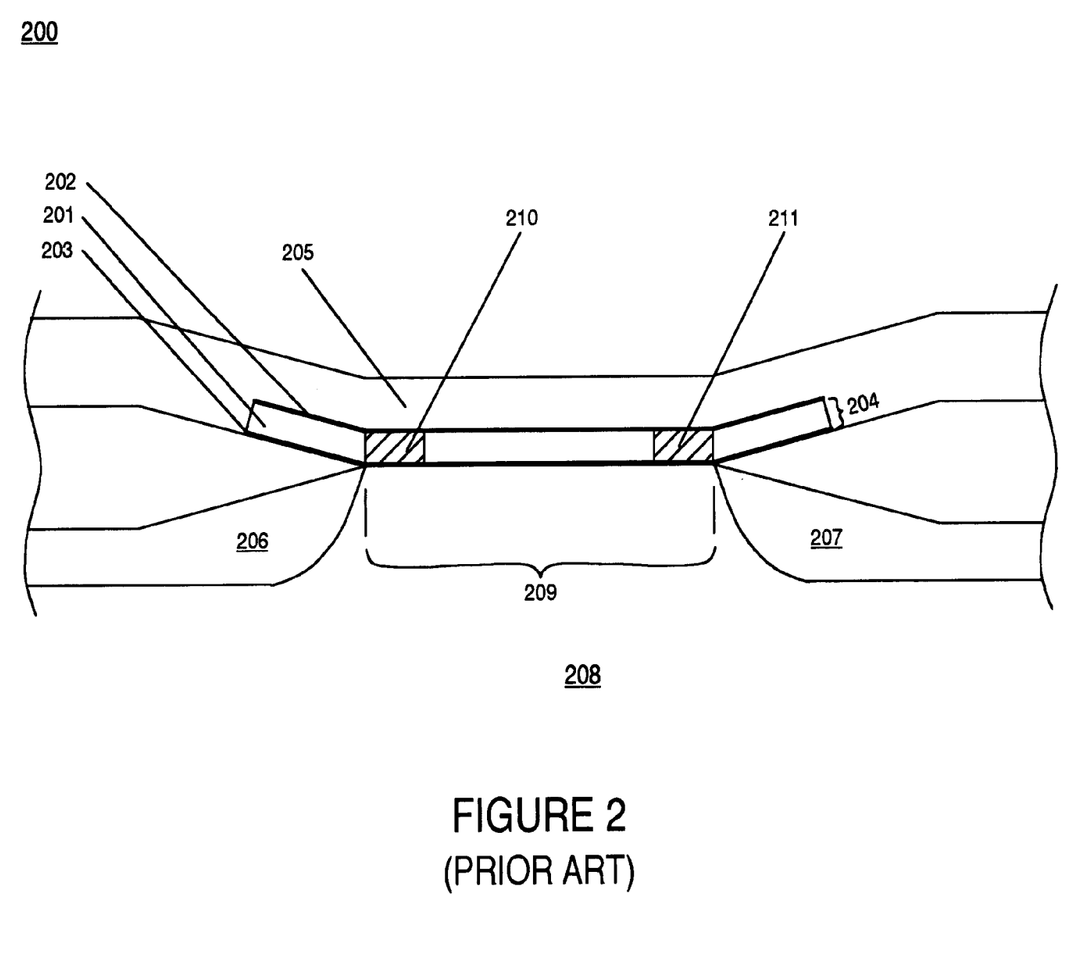
FIG. 2 is a cross section view of an exemplary prior art nitride gate flash memory device.

More recently, dual bit flash memory devices have been introduced that allow the storage of two bits of information in two separate cells of a single memory device. The dual bit flash memory device uses what is known as a virtual ground architecture in which the source of one cell in the device serves as the drain of the other cell. FIG. 2 illustrates an exemplary prior art dual bit memory cell 200. Memory cell 200 comprises a silicon nitride layer 201 which is disposed between a top silicon dioxide layer 202 and a bottom silicon dioxide layer 203, forming an ONO layer 204. A polysilicon layer 205 resides over the ONO layer 204 and provides a wordline connection to the memory cell 200. The structure comprising ONO layer 204 and polysilicon layer 205 is also referred to as a nitride gate array. A first bitline 206 and a second bitline 207 run underneath the ONO layer 204. Memory cell 200 resides on P-type substrate 208 with the conductive portion of the bitlines 206 and 207 formed from an N+ implant, such that a channel 209 is formed across the P-type substrate 208 when the bitlines are biased. Memory cell 200 is a single transistor having interchangeable source and drain components formed from bitlines 206 and 207 with a gate formed as part of a polysilicon wordline 205.

Silicon nitride layer 201 forms a charge trapping layer. The programming of dual bit memory cell 200 is done by channel hot electron injection, which stores a localized charge in the oxide-nitride interface of ONO layer close to the drain side of the cell. Since the silicon nitride layer 201 is non-conducting, a first charge can be injected into silicon nitride layer 201 near the junction of bitline 206 and ONO layer 204 and stored as left bit 210. Similarly, and a second charge can be injected and stored in silicon nitride layer 201 near the junction of bitline 207 and ONO layer 204 and stored as right bit 211.

The dual bit memory cell 200 is symmetrical allowing the drain and the source to be interchangeable. Thus, bitline 206 may serve as the drain terminal and bitline 207 may serve as the source terminal when programming left bit 210. Likewise, bitline 207 may serve as the drain terminal and bitline 206 may serve as the source terminal for programming right bit 211.

Figure 3:
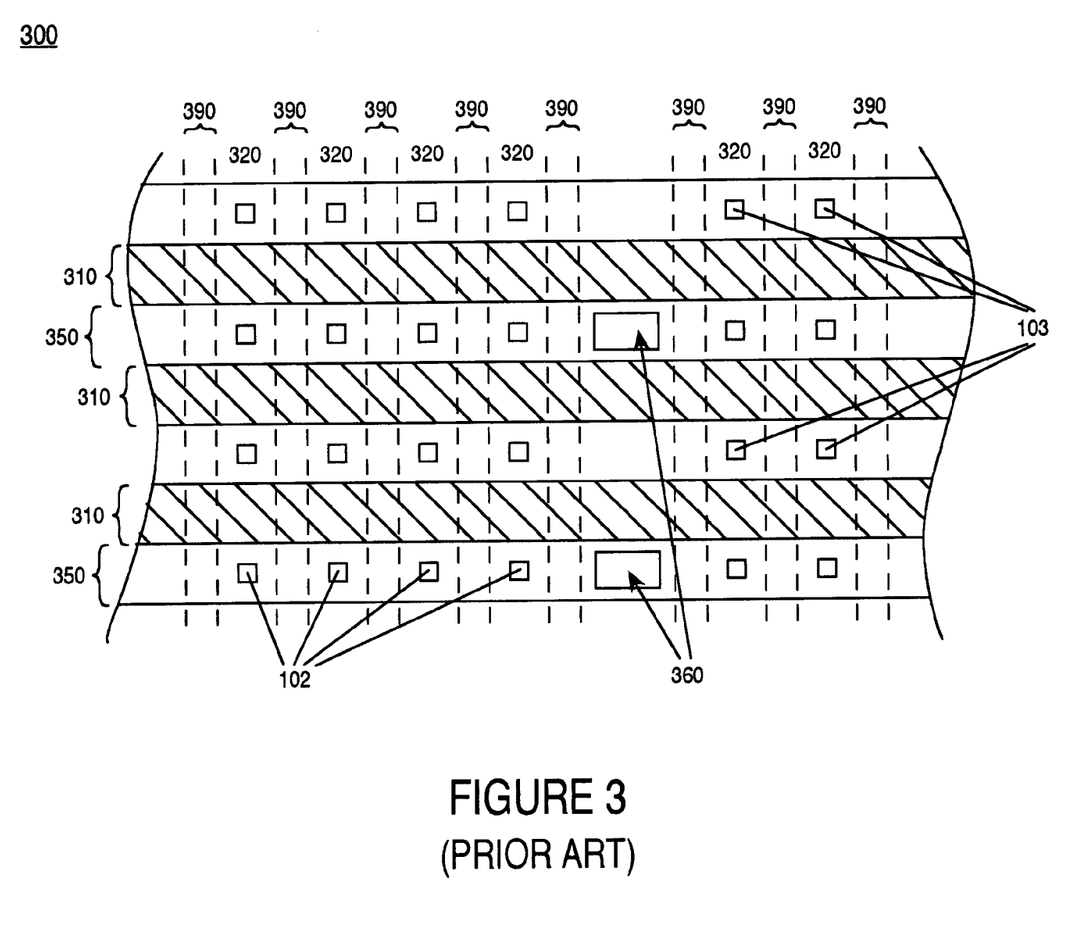
FIG. 3 is a view of an exemplary prior art flash memory array.

FIG. 3 shows an exemplary flash memory array. Typically, a flash memory array is comprised of rows of memory cells (e.g., memory cell 100 of FIG. 1) in which the control gates (e.g., control gate 108 of FIG. 1) of the memory cells are coupled by a common wordline (e.g., wordlines 310 of FIG. 3). Similarly, the drain regions (e.g., drain region 103 of FIG. 1) are coupled in columns by a common bitline (e.g., bitlines 320 of FIG. 3). Each column of the memory cells is isolated from adjoining columns by an insulating layers such as a shallow trench isolation structures 390 in the substrate that run between and parallel to bitlines 320.

A plurality of source lines 350 extend in the row direction, that is parallel to wordlines 310 and couple the source regions 102 of adjoining memory cells in a row. One source region may be shared as a common source region in adjoining rows of memory cells. Similarly, one drain region may be shared as a common drain region in adjoining rows of memory cells. A plurality of source contacts 360 (also referred to as $V_{ss}$ pickups or $V_{ss}$ contacts) supply electrical current to the source regions of the memory cells.

Usually, in order to reduce the resistance, dopants are implanted in the $V_{ss}$ diffusion at a greater concentration. However, this leads to a deeper source region doping profile which shortens the channel region (e.g., channel region 109 of FIG. 1). As the channel length between the source region 102 and drain region 103 is decreased, the memory cells may exhibit undesirable characteristics that are commonly referred to as "short channel effects." For example, controlling unintended electrostatic interactions between the source and drain is more difficult to control in short-channel devices because the threshold voltage ($V_T$) of the device is lowered in short channel devices. Additionally, as the drain bias is increased, the drain depletion region widens into the channel and can merge with the source depletion region. This results in punch-through leakage between the source and drain and loss of gate control over the memory cell. This encroachment of the depletion region from the drain into the channel is known as Drain Induced Barrier Lowering (DIBL) and is becoming increasingly problematic as the size of memory cells continues to shrink.

An increase in leakage current is especially problematic in flash memory devices as they are widely used in very low power applications, for example mobile telephones, due to the ability of flash memory to retain information without applied power. Increases in leakage current may significantly increase total power consumption of a product using the flash device.

Figure 4:
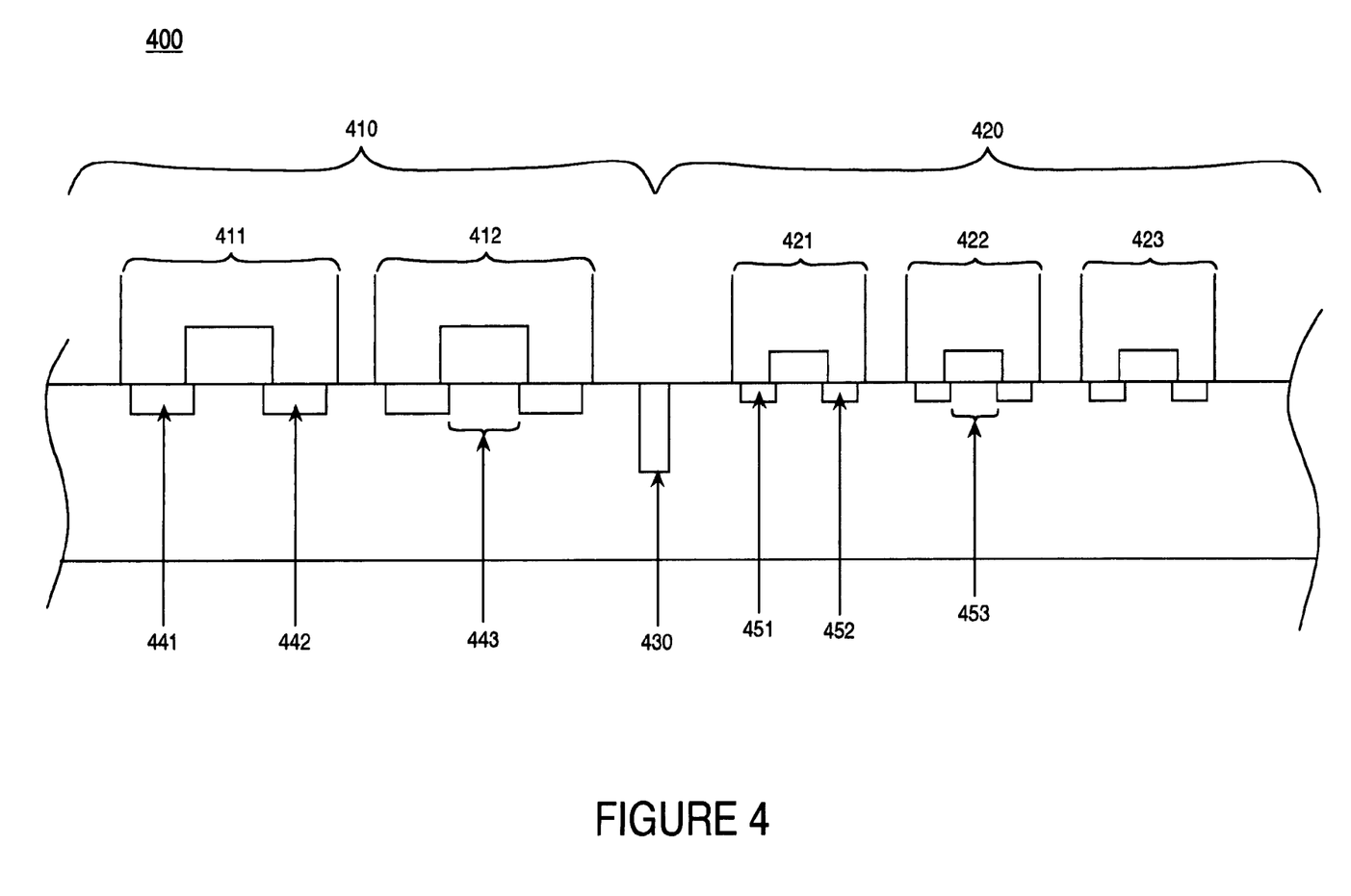
FIG. 4 is a cross section view of an exemplary prior art memory device.

FIG. 4 is a cross section view of an exemplary prior art flash memory device 400. A conventional flash memory device comprises an array of memory cells (e.g., memory cells 421, 422, and 423 of FIG. 4) that is commonly referred to as the "core array" (e.g., core array 420 of FIG. 4). Additional components are commonly referred to as the "periphery devices" (e.g., devices 411 and 412 of FIG. 4) are disposed outside of the core array (e.g., in periphery region 410 of FIG. 4) and are typically used for a variety of tasks such as logic functions, state machines, data management, selector switches, addressing decoders (e.g., x-line address decoders and y-line address decoders), high voltage generators, etc. In order to reduce the size and power consumption of flash memory devices, manufacturers have concentrated upon decreasing the size of the memory cells. For example, smaller gate arrays and shorter channel lengths (e.g., channel length 453 of FIG. 4) facilitate more compact memory arrays that require less power. However, while the size of the memory cells has been decreasing, the size of the periphery devices has essentially remained unchanged. This is due, in part to the fact that shrinking the size of the periphery devices does not result in a corresponding shrinking of the overall size of the flash memory device because of the relatively fewer components involved. Thus, periphery devices are characterized by larger gate arrays and longer channel lengths (e.g., channel length 443 of FIG. 4) relative to the scale of the memory cells.

In a conventional fabrication process, the implanting of dopants is performed in the core region before the implanting of dopants in the periphery is performed. Because of the different scales of the devices, different process parameters are necessitated for implanting of the dopants. Following the implanting of the periphery dopants, an annealing process is performed which activates the dopants and diffuses them into the substrate. The process parameters of the annealing determine some of the electrical characteristics of the semiconductor structures such as junction depth, resistance, and activation of the dopants. For example, the depth to which dopants are diffused in the source and drain of a periphery device (e.g., source 441 and drain 442 of FIG. 4) may require a different set of time and temperature parameters than the annealing process needed to diffuse the dopants in the source and drain areas of the memory cells (e.g., source 451 and drain 452 of FIG. 4). Ideally, all of the semiconductor devices would be sized nearly identically (e.g., similar channel lengths, similar doping profiles, similar junction depths, similar resistance, etc.). However, as stated above, the memory cells in the core are scaled differently than the devices in the periphery region. As a result, an annealing process that is optimized for the core cells may not be adequate for the periphery devices. For example, a shorter annealing process may be appropriate for the core cells to avoid short channel effects that result from excessive diffusing of the dopants in the core array. However, the relatively larger structures in the periphery require different optimal process parameters such as the length and/or temperature of the annealing process. Similarly, an annealing process optimized for the periphery devices may exceed optimal parameters for the core cells. For example, an overly long annealing process may cause excessive diffusion of the dopants in the source and drain regions and result in short channel effects being exhibited in the memory cells.

Thus, conventional methods for fabricating flash memory devices are disadvantageous in that the annealing process results in dopant diffusion profiles that are not optimal for the core cells and/or the periphery cells.

SUMMARY OF THE INVENTION

A method for fabricating a memory device is disclosed. In one embodiment, an impurity concentration is created in a semiconductor substrate of a memory device. An annealing process is then performed. A second impurity concentration is created in a second region of the semiconductor substrate and a second annealing process is performed.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

DETAILED DESCRIPTION OF THE PREFERRED EMBODIMENT

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 5:
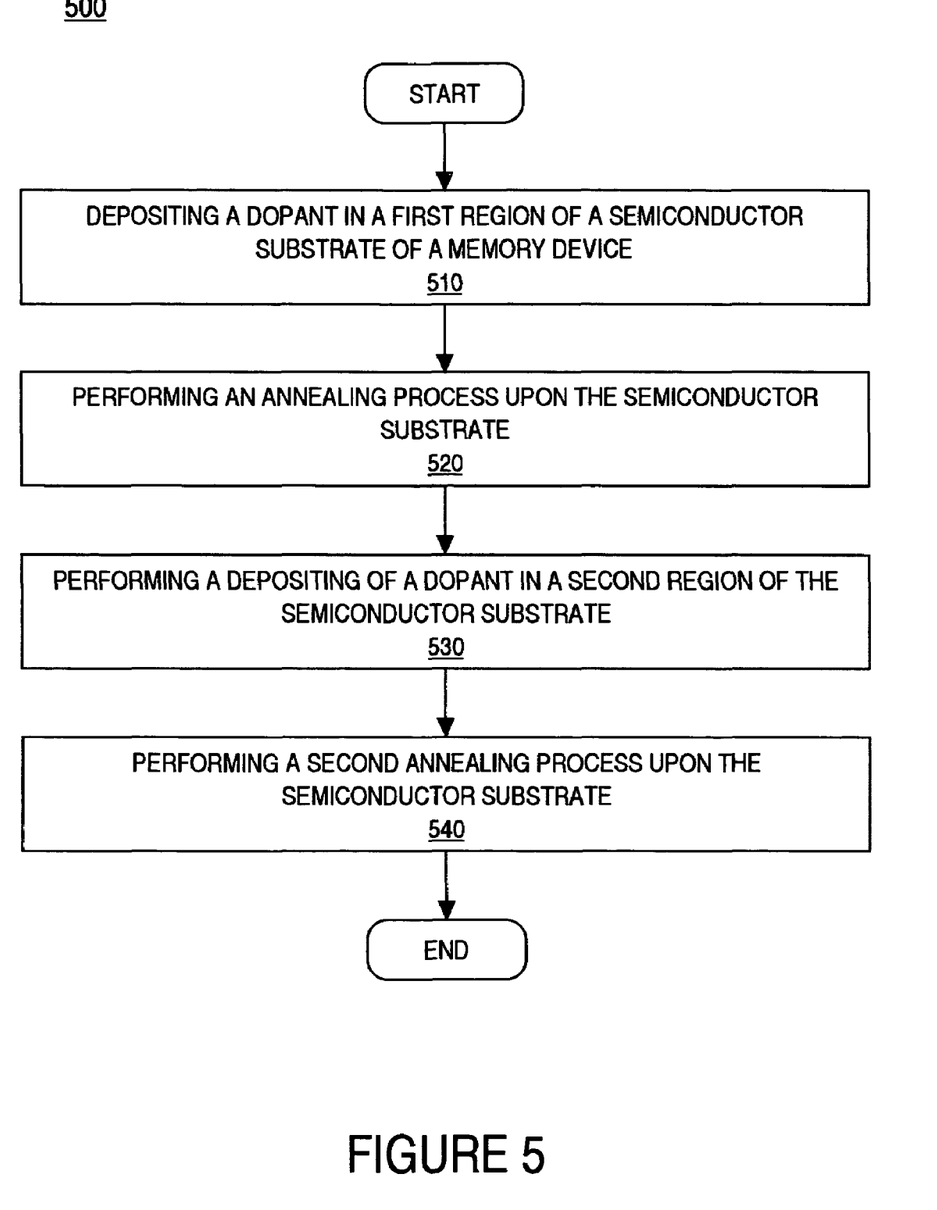
FIG. 5 is a flowchart of a method for fabricating a memory device in accordance with embodiments of the present invention.
Figure 6A:
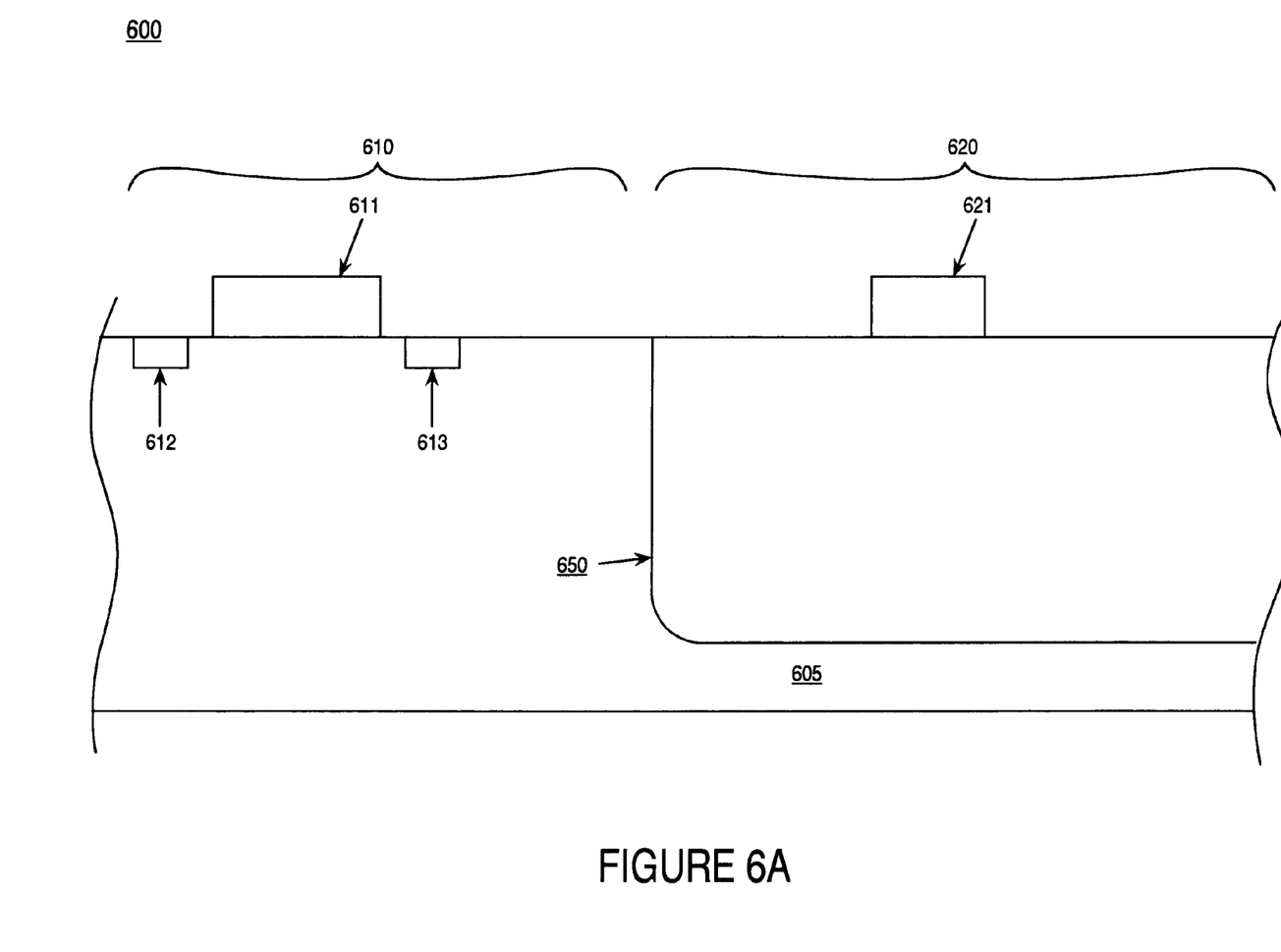
FIGS. 6A, 6B, 6C, 6D, and 6E are cross section views showing structures the structures formed in fabricating a memory device in accordance with embodiments of the present invention.

FIG. 5 is a flowchart of a method 500 for fabricating a memory device in accordance with embodiments of the present invention. In step 510 of FIG. 5, a dopant is deposited in a first region of a semiconductor substrate of a memory device. Referring now to FIG. 6A, dopants are deposited in impurity concentrations 612 and 613 of first region 610 of a memory device 600. In embodiments of the present invention, previous fabrication steps have been preformed upon memory device 600 such as deposition of n-type wells (not shown), deposition of a high voltage p-type well 650 in the core region, and fabrication of a gate array 611 upon semiconductor substrate 605. Additionally, the gate array 621 of a memory cell has been fabricated upon semiconductor substrate 605 in a second region 620. In embodiments of the present invention, first region 610 corresponds to a periphery region of memory device 600 and second region 620 corresponds to the core array region. In the embodiment of FIG. 6A, the gate length of gate array 611 is longer than the gate length of gate array 621.

There are a variety of methods for creating impurity concentrations 612 and 613 in embodiments of the present invention such as diffusion, chemical vapor deposition, plasma enhanced chemical vapor deposition, low pressure chemical vapor deposition, or high energy implanting of dopants into semiconductor substrate 605. While the present embodiment recites these methods for depositing dopants specifically, the present invention is well suited to utilizing other deposition methods as well. Furthermore, it is appreciated that the depth of the doping profile for impurity concentrations 612 and 613 may be influenced by the type and duration of the deposition process. In FIG. 6A, impurity concentrations 612 and 613 may correspond, for example, with source and drain areas of a periphery device.

Figure 6B:
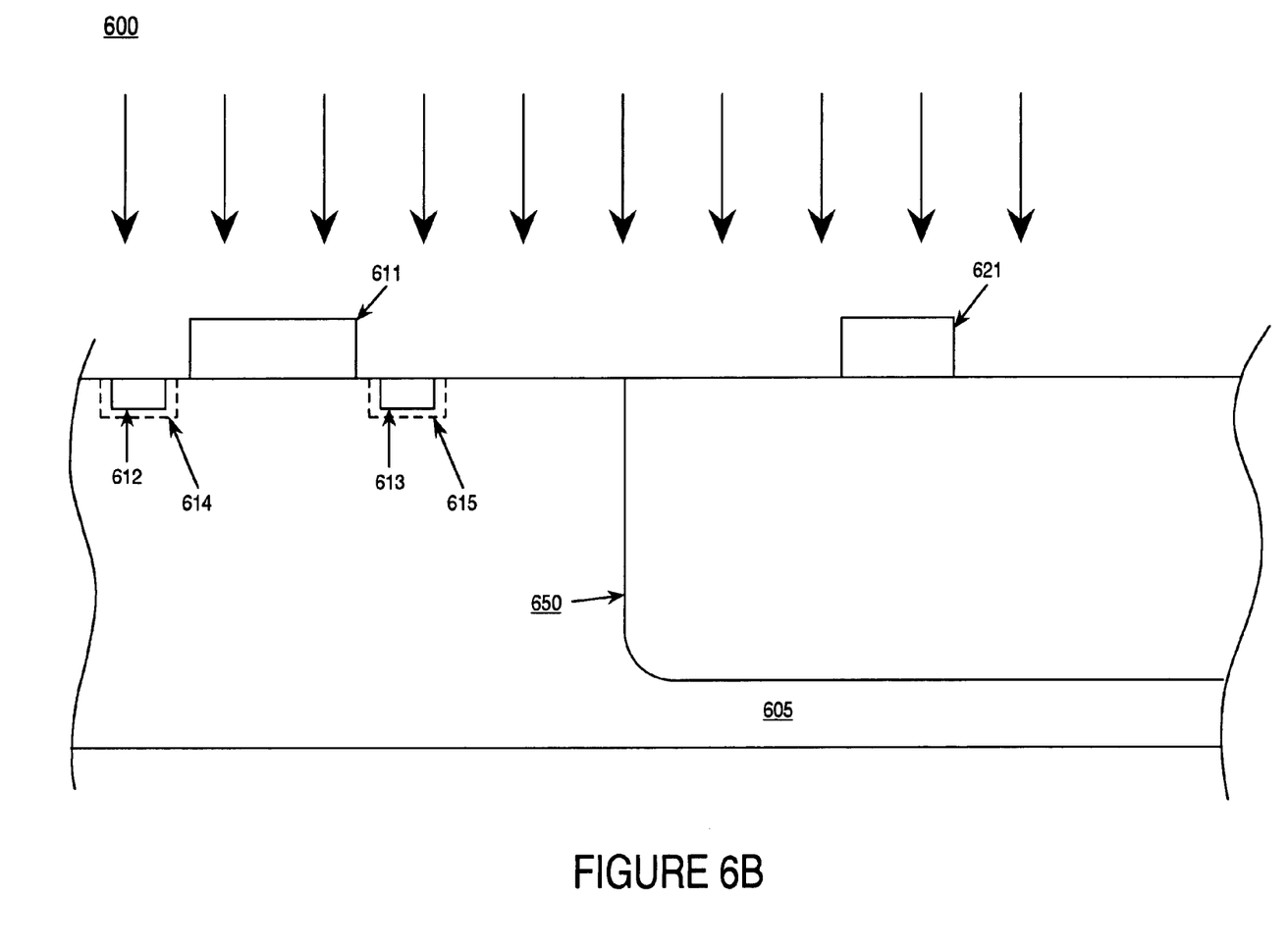

In step 520 of FIG. 5, an annealing process is performed upon the semiconductor substrate. Referring now to FIG. 6B, when the annealing process is performed, the dopants deposited in impurity concentrations 612 and 613 are diffused into the surrounding substrate 605. Annealing is a process used in the manufacture of semiconductor devices in which the device is subjected to a high heat for a controlled amount of time. Annealing is used to repair damage to semiconductor substrate 605 as a result of implanting the dopants in step 510. Annealing is also used to activate the dopants and to restore some electron mobility that is lost during step 510. Annealing characteristics depend, among other things, upon the type and dose of dopant used in step 510. Therefore, the type and dose of dopant used in step 510, as well as the desired electrical characteristics (e.g. junction depth, channel length, and electrical resistance, etc.) of the finished peripheral device are taken into account when selecting the parameters of the annealing in step 520. In one embodiment, a rapid thermal annealing (RTA) process is used in step 520 of the present invention. However, while the present embodiment recites RTA specifically, the present invention is well suited to utilize other processes as well.

In embodiments of the present invention, the parameters of the annealing process of step 520 are selected to only partially diffuse the dopants. In other words, the parameters of the annealing process are chosen such that the dopants are not diffused to the final or optimal desired level of diffusion. Thus, if the final desired level of diffusion is considered 100% diffused, the parameters of the annealing process in step 520 are some partial value such as, for example, a 20% diffusion, a 25% diffusion, etc. Again, while the present embodiment recites these specific values, the present invention is well suited to a variety of values for step 520. Referring again to FIG. 6B, following the annealing process of step 520, the dopants in impurity concentrations 612 and 613 are diffused to create impurity concentrations 614 and 615 respectively. That is the dopants in impurity concentration 612 are diffused into substrate 605 to create impurity concentration 614, and the dopants in impurity concentration 613 are diffused into substrate 605 to create impurity concentration 615.

Figure 6C:
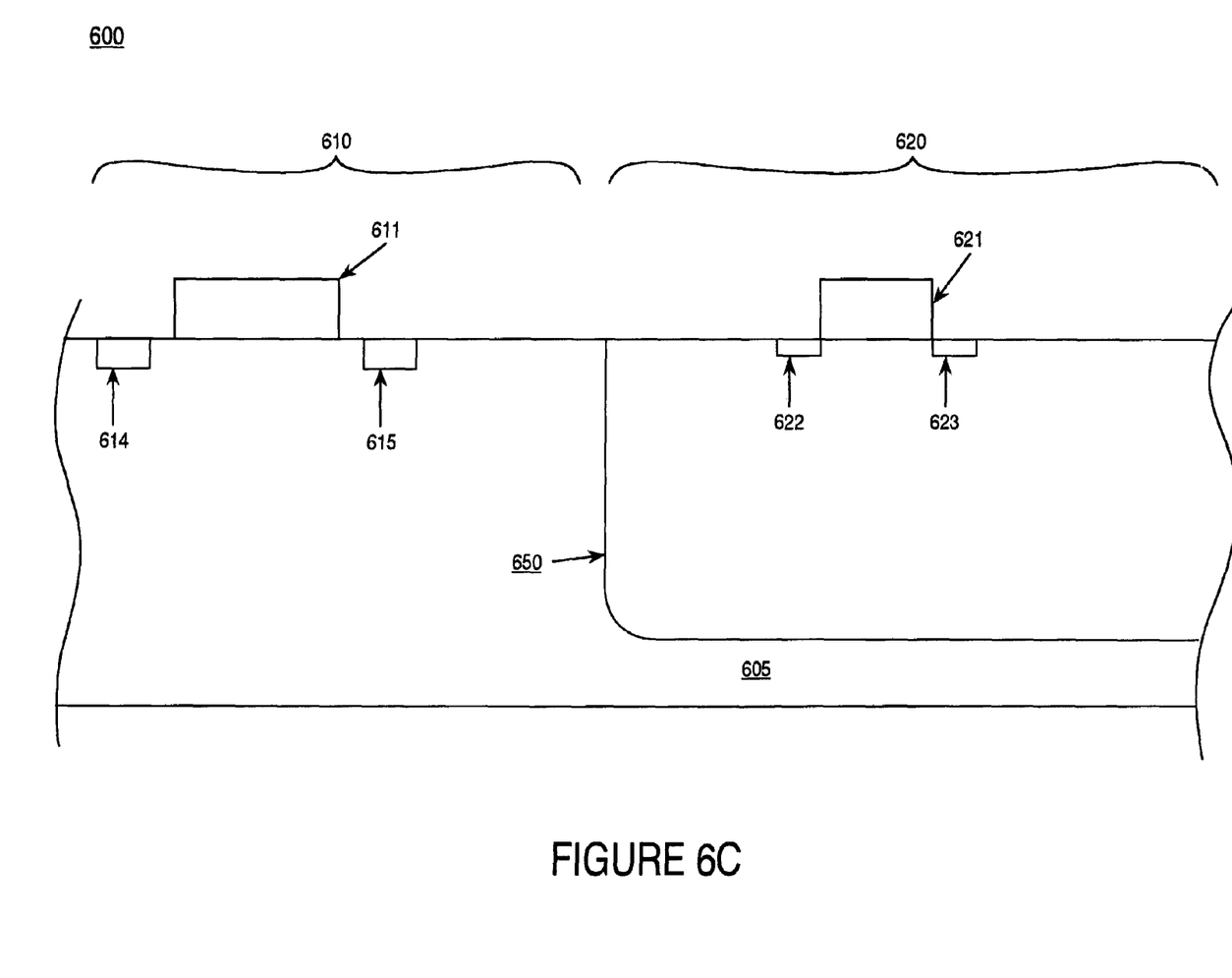

In step 530 of FIG. 5, a depositing of a dopant in a second region of the semiconductor substrate is performed. Referring now to FIG. 6C, impurity concentrations 622 and 623 are deposited in second region 620 of semiconductor substrate 605. In the embodiment of FIG. 6C, second region 620 comprises the core array of a memory device such as a flash memory device. As described in the above discussion of step 510, there are a variety of methods for depositing impurity concentrations 622 and 623 in embodiments of the present invention. Impurity concentrations 622 and 623 may be, for example, the source and drain regions of a memory cell in the core array of memory device 600.

Figure 6D:
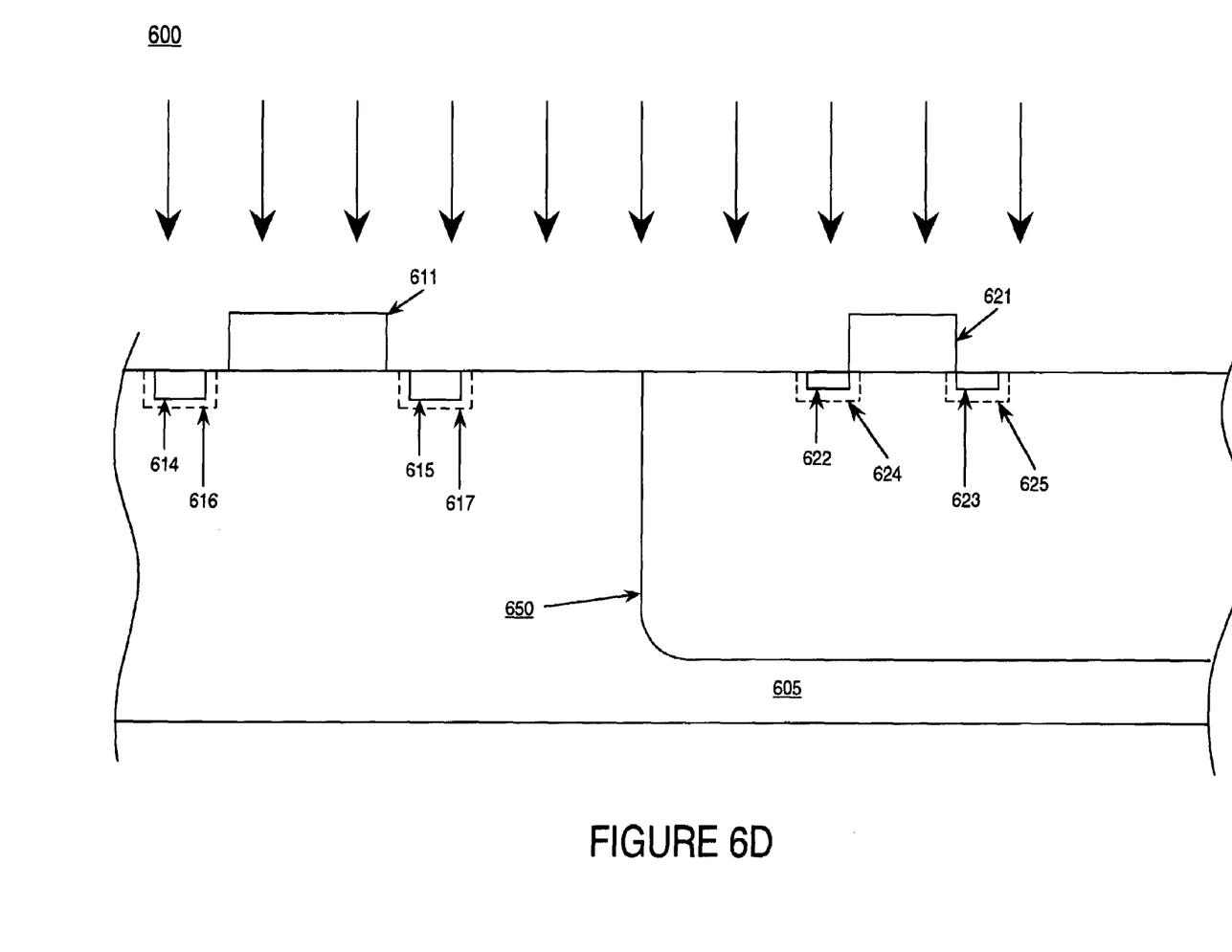

In step 540 of FIG. 5, a second annealing process is performed upon the semiconductor substrate to create impurity concentrations 624 and 625 respectively. Referring now to FIG. 6D, a second annealing process is performed that diffuses the dopants in impurity concentrations 622 and 623 further into substrate 605. That is the dopants in impurity concentration 622 are diffused further into substrate 605 to create impurity concentration 624, and the dopants in impurity concentration 633 are diffused further into substrate 605 to create impurity concentration 625. Additionally, the dopants in impurity concentrations 614 and 615 are concurrently diffused further into substrate 605. That is, the dopants in impurity concentration 614 are diffused further into substrate 605 to create impurity concentration 616, and the dopants in impurity concentration 615 are diffused further into substrate 605 to create impurity concentration 617.

Figure 6E:
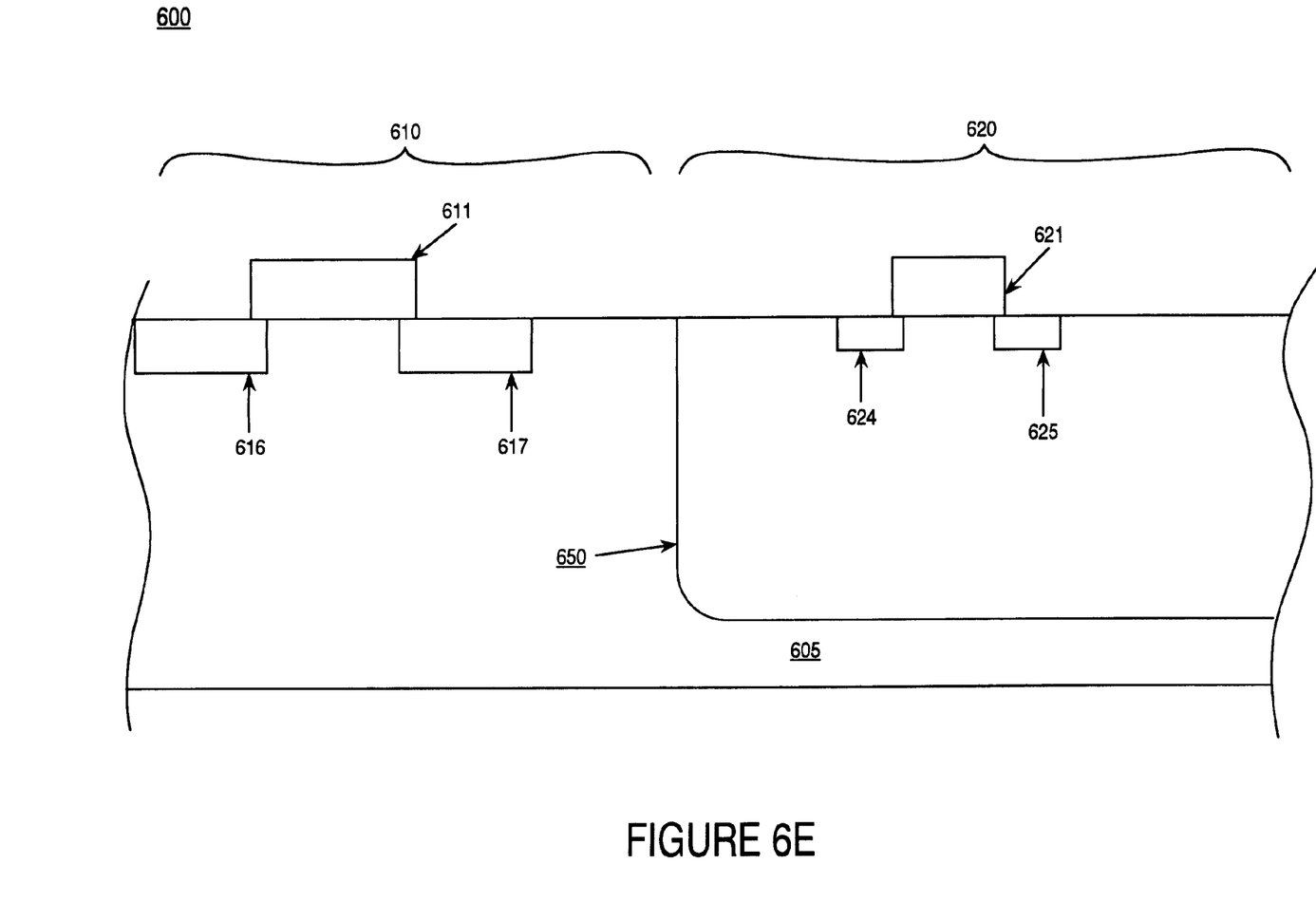

In the embodiment of FIG. 6D, the second annealing process of step 540 comprises a full annealing of the dopants in impurity concentrations 622 and 623. In other words, the parameters of the annealing process of step 540 are selected to create impurity concentrations 624 and 625 and are based upon the electrical characteristics of the memory cell in core area 620. Additionally, the second annealing process of step 540, in conjunction with the annealing process of step 520, comprise a cumulative annealing process for the dopants deposited in first region 610 (e.g. impurity concentrations 612 and 613). In other words, having prior knowledge of the process parameters of the annealing process of step 540, the process parameters of the annealing process of step 520 are selected such that the cumulative result of both annealing processes result in impurity concentrations 616 and 617. For example, if the parameters of the second annealing process of step 540 comprise a 25% diffusion of total desired diffusion of the dopants in the impurity concentrations in first region 610, the parameters of the first annealing process are selected to comprise a 75% diffusion of the dopants in region 610. Thus, the cumulative effect of both of the annealing processes results in a 100% diffusion of the dopants in first region 610 and in second region 620. It is appreciated that the process parameters of the cumulative annealing process of the dopants in first region 610 are selected based upon the electrical characteristics of the semiconductor device in first region 610. Referring now to FIG. 6E, as a result of the cumulative annealing process of the present invention, a semiconductor device in first region 610 is fabricated upon a semiconductor substrate that is of a greater scale than a second semiconductor device in second region 620 of the same semiconductor substrate.

The present invention is advantageous over conventional fabrication methods in that the processing parameters of the two annealing processes can be selected such that the electrical characteristics of semiconductor devices of different scales can be more easily accommodated. In conventional fabrication processes, using a single annealing process meant that the process parameters were selected based upon the electrical characteristics of the peripheral devices or, more typically, of the core array memory cells in order to minimize short channel effects in the memory cells. However, these process parameters typically are not suitable for the larger scale of the periphery devices. For example, process parameters that are suitable for the smaller scale of the memory cells may result in a dopant diffusion profile that is too shallow for the periphery devices or that does not diffuse sufficiently into the channel region.

In using a cumulative annealing process, the present invention facilitates using different process parameters for different scale semiconductor devices disposed upon the same semiconductor substrate. For example, process parameters for a first annealing (e.g., step 520 of FIG. 5) may comprise a rapid thermal anneal performed at a temperature in the range of 1020–1050° C. for a period of approximately 10–30 seconds. The process parameters for a second annealing (e.g., step 540 of FIG. 5) may comprise a rapid thermal anneal performed at a temperature in the range of 1000–1020° C. for a period of approximately 5–10 seconds. Thus, if the process parameters of the second annealing process, that are selected based upon the electrical characteristics of the memory cells in the core array, only comprise 25% of the cumulative annealing process for the periphery devices, the process parameters of the first annealing process may be selected to perform 75% of the cumulative annealing process for the periphery devices. It is appreciated that if memory device 600 comprised, for example, semiconductor devices of 3 different scales, that method 600 may comprise a third depositing of a dopant and a third annealing process.

Figure 7:
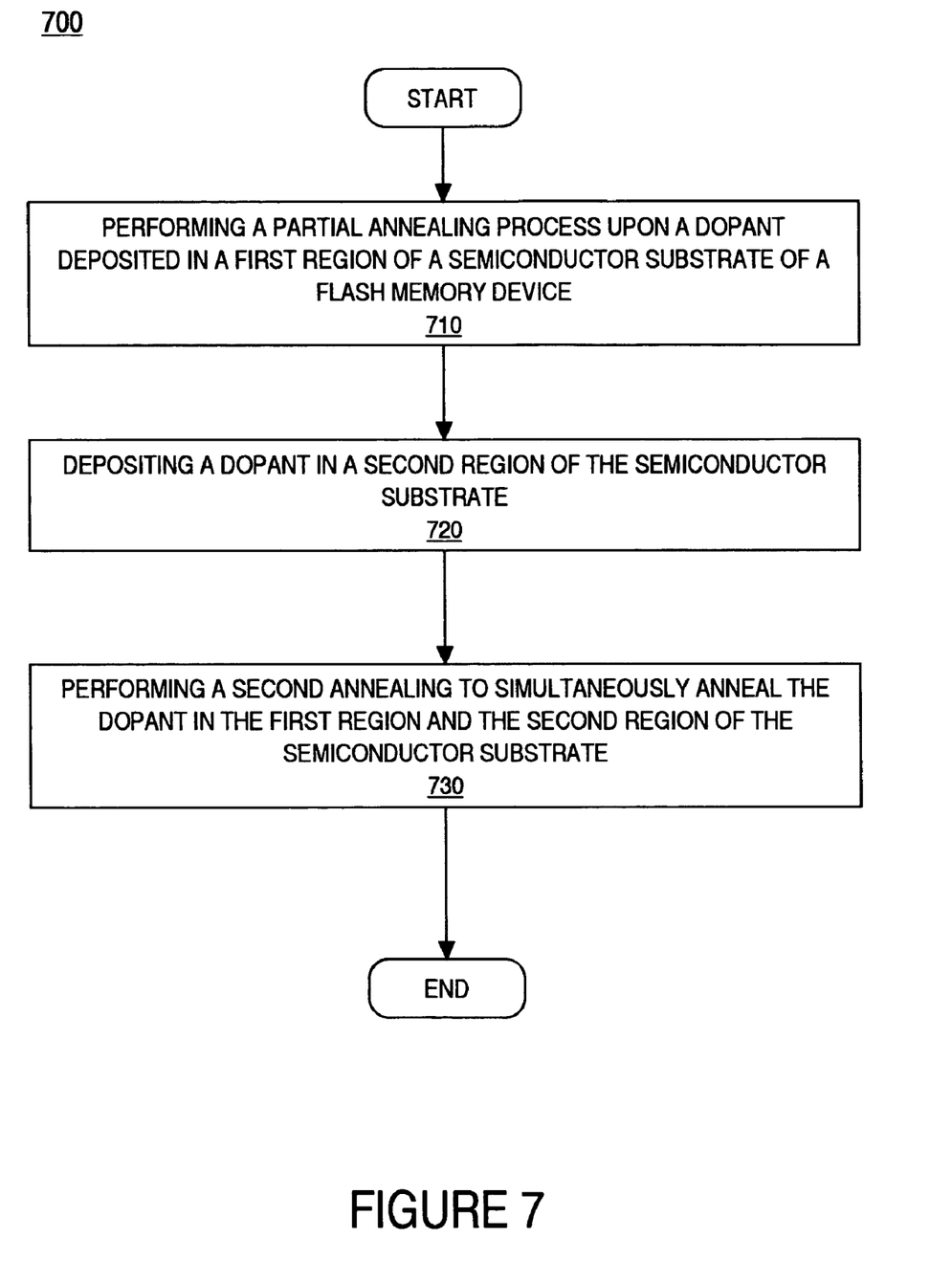
FIG. 7 is a flowchart of a method for fabricating a flash memory device in accordance with embodiments of the present invention.

FIG. 7 is a flowchart of a method 700 for fabricating a flash memory device in accordance with embodiments of the present invention. In step 710 of FIG. 7, a partial annealing process is performed upon a dopant implanted in a first region of a semiconductor substrate of a flash memory device. Referring again to FIG. 6B, a first annealing process is performed upon a dopant implanted in first region 610 of semiconductor substrate 605. Again, in the embodiment of FIG. 7, the process parameters of the partial annealing process are selected such that the dopants are not fully diffused into substrate 605 based upon the desired electrical characteristics of the semiconductor device being fabricated. When step 710 is performed, dopants in impurity concentrations 612 and 613 further diffuse into semiconductor substrate 605 to create impurity concentrations 614 and 615 respectively. As discussed above, the process parameters of the first annealing process are selected based upon the electrical characteristics of the semiconductor device being fabricated in first region 610 as well as the process parameters of an annealing process to follow in step 730 of FIG. 7.

In step 720 of FIG. 7, a dopant is implanted in a second region of the semiconductor substrate. Referring again to FIG. 6C, impurity concentrations 622 and 623 are deposited in semiconductor substrate 605.

In step 730 of FIG. 7, a second annealing is performed to simultaneously anneal the dopant in the first region and in the second region of the semiconductor substrate. Referring again to FIG. 6D, a second annealing process is performed upon semiconductor substrate 605 which simultaneously anneals dopants in first region 610 and second region 620 of semiconductor device 600. As discussed above, the parameters of the second annealing process are selected based upon the electrical characteristics of the semiconductor device being fabricated in second region 620. In other words, the parameters of the second annealing process are selected such that the diffusion profile of impurity concentrations 624 and 625 are created. Additionally, the second annealing process, in conjunction with the first annealing process performed in step 710, comprise a cumulative annealing of the semiconductor device being fabricated in first region 610 of FIG. 6A. The parameters of the cumulative annealing process are selected such that the diffusion profile of impurity concentrations 616 and 617 are created.

As discussed above, the present invention is advantageous over conventional fabrication processes in that it facilitates fabrication of semiconductor devices of different scales upon the same semiconductor substrate. In the embodiment of FIG. 7, first region 610 comprises the periphery region of memory device 600 while second region 620 comprises the core array of memory cells of memory device 600. In embodiments of the present invention, memory device 600 is a flash memory device.

Figure 8:
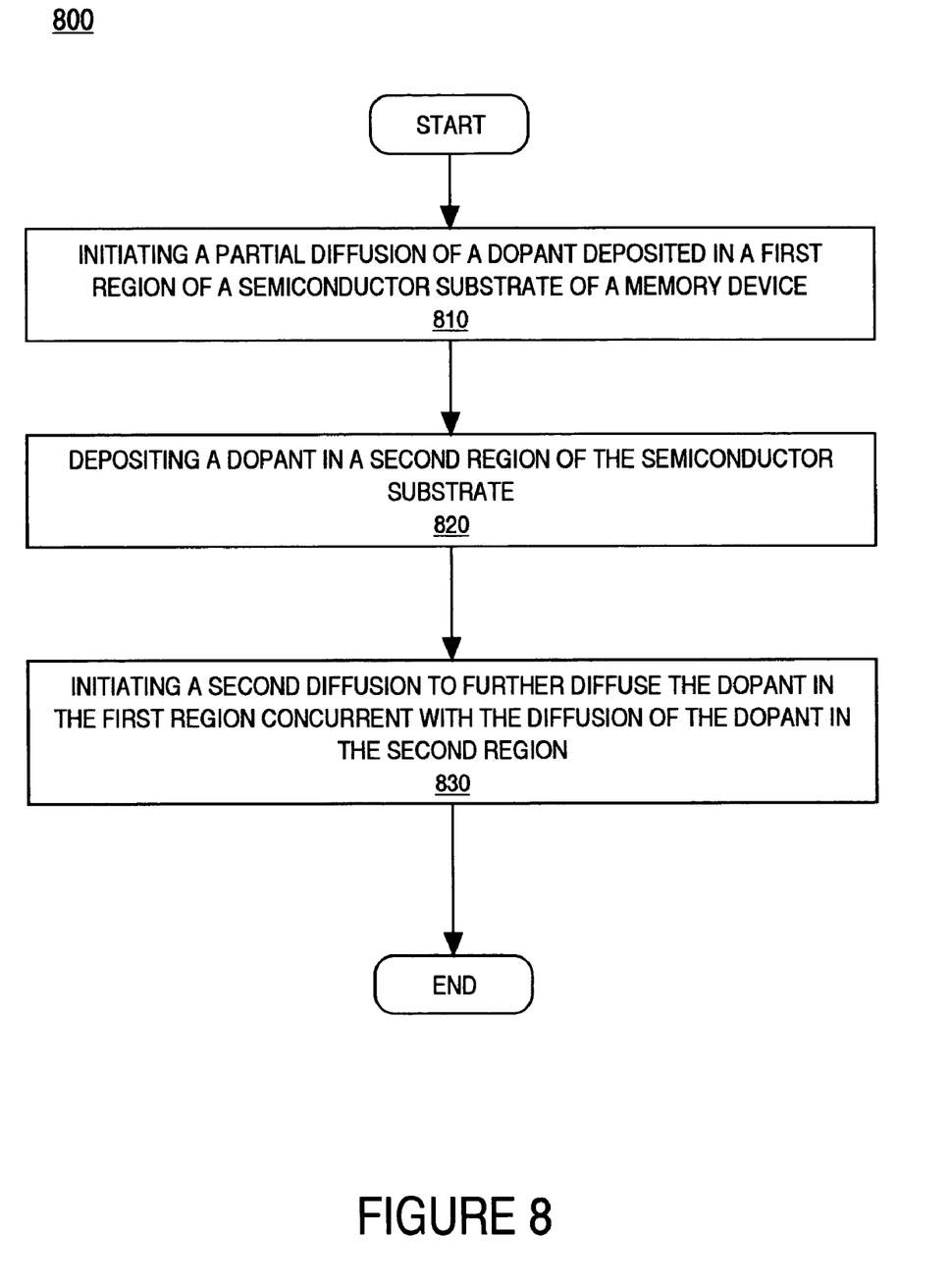
FIG. 8 is a flowchart of a method for fabricating a memory device in accordance with embodiments of the present invention.

FIG. 8 is a flowchart of a method 800 for fabricating a memory device in accordance with embodiments of the present invention. In step 810 of FIG. 8, a partial diffusion is initiated upon a dopant deposited in a first region of a semiconductor substrate of a memory device. Referring again to FIG. 6B, an annealing process is performed which diffuses dopants in impurity concentrations 612 and 613 further into semiconductor substrate 605 such that impurity concentrations 614 and 615 are created. In the embodiment of FIG. 8, impurity concentrations 614 and 615 are only a partial diffusion of the cumulative doping profile (e.g., impurity concentrations 616 and 617 of FIG. 6E).

In step 820 of FIG. 8, a dopant is deposited in a second region of the semiconductor substrate. Referring again to FIG. 6C, impurity concentrations 622 and 623 are created by depositing a dopant in second region 620 of FIG. 6C.

In step 830 of FIG. 8, a second diffusion is initiated to further diffuse the dopant in the first region concurrent with the diffusion of the dopant in the second region of the semiconductor substrate. As discussed above, the parameters of the second annealing process are selected based upon the electrical characteristics of the semiconductor device being fabricated in second region 620. In other words, the parameters of the second annealing process are selected such that the diffusion profile of impurity concentrations 624 and 625 are created. Additionally, the second annealing process, in conjunction with the first annealing process performed in step 710, comprise a cumulative annealing of the semiconductor device being fabricated in first region 610 of FIG. 6A. The parameters of the cumulative annealing process are selected such that the diffusion profile of impurity concentrations 616 and 617 are created.

The preferred embodiment of the present invention, a method for fabricating a memory device, is thus described. While the present invention has been described in particular embodiments, it should be appreciated that the present invention should not be construed as limited by such embodiments, but rather construed according to the following claims.

What is claimed is:

1. A method for fabricating a memory device comprising:
  depositing a first dopant in a first region of a semiconductor substrate of said memory device;
  subsequent to said depositing said first dopant, performing a first annealing process upon said semiconductor substrate, wherein said first annealing process diffuses said first dopant a pre-determined percentage of a first complete diffusion state;
  subsequent to said performing said first annealing process, depositing a second dopant in a second region of said semiconductor substrate; and
  subsequent to said depositing said second dopant, performing a second annealing process upon said semiconductor substrate, wherein said second annealing process diffuses said first dopant to said first complete diffusion state and said second dopant to a second complete diffusion state.

2. The method as recited in claim 1, wherein said depositing said first dopant comprises creating first impurity concentration in said first region of said semiconductor substrate of a flash memory device, and wherein said depositing of said second dopant comprises creating a second impurity concentration in said second region of said semiconductor substrate of said flash memory device.

3. The method as recited in claim 1, wherein said depositing said first dopant comprises depositing said first dopant for a plurality of semiconductor devices in a periphery region of said memory device.

4. The method as recited in claim 3, wherein said performing said second dopant depositing comprises depositing said second dopant for a plurality of memory cells in a core region of said semiconductor substrate of said memory device.

5. The method as recited in claim 4, wherein a plurality of parameters of said second annealing process are selected based upon an electrical characteristic of said plurality of memory cells.

6. A method for fabricating a flash memory device comprising:
  performing a first partial annealing process upon a first dopant deposited in a first region of a semiconductor substrate of said flash memory device;
  subsequent to said first annealing process, depositing a second dopant in a second region of said semiconductor substrate; and
  subsequent to depositing said second dopant, performing a second annealing process wherein said first dopant and said second dopant are simultaneously annealed.

7. The method as recited in claim 6, wherein said first region comprises a plurality of semiconductor devices disposed in a periphery region of said flash memory device and wherein said partial annealing process is performed upon said plurality of semiconductor devices, and wherein said partial annealing process renders a partially annealed state of said semiconductor devices.

8. The method as recited in claim 7, wherein said second region comprises a plurality of memory cells disposed in a core region of said flash memory device and wherein said second annealing process renders a completely annealed state of said plurality of memory cells and a complete annealed state of said plurality of semiconductor devices.

9. The method as recited in claim 8, wherein a plurality of parameters of said second annealing process are selected based upon an electrical characteristic of said plurality of memory cells.

10. The method as recited in claim 9, wherein a plurality of parameters of said partial annealing process are selected based upon an electrical characteristic of said plurality of semiconductor devices and upon said plurality of parameters of said second annealing process.

11. A method for fabricating a memory device comprising:
  initiating a partial diffusion of a first dopant deposited in a first region of a semiconductor substrate of a memory device;
  subsequent to said partial diffusion, depositing a second dopant in a second region of said semiconductor substrate; and
  subsequent to depositing said second dopant, initiating a second diffusion of said first and second dopants wherein said first dopant is further diffused concurrent with the diffusion of said second dopant.

12. The method as recited in claim 11, wherein said memory device is a flash memory device.

13. The method as recited in claim 11, wherein said first region comprises a plurality of semiconductor devices disposed in a periphery region of said memory device.

14. The method as recited in claim 13, wherein said second region comprises a plurality of memory cells disposed in a core region of said memory device.

15. The method as recited in claim 14, wherein a plurality of parameters of said second diffusion are selected based upon an electrical characteristic of said plurality of memory cells.

16. The method as recited in claim 15, wherein said partial diffusion and said second diffusion comprise a cumulative diffusion for said plurality of semiconductor devices.

17. The method as recited in claim 16, wherein a plurality of parameters of said cumulative diffusion are selected based upon an electrical characteristic of said plurality of semiconductor devices.

* * * * *